US008051341B2

(12) United States Patent
Cho et al.

(10) Patent No.: US 8,051,341 B2
(45) Date of Patent: Nov. 1, 2011

(54) SEMICONDUCTOR MEMORY DEVICE HAVING TEST ADDRESS GENERATING CIRCUIT AND METHOD OF TESTING SEMICONDUCTOR MEMORY DEVICE HAVING A TEST ADDRESS GENERATING CIRCUIT

(75) Inventors: Yong-Hwan Cho, Chungcheongnam-do (KR); Hyung-Dong Kim, Gyeonggi-do (KR); Woo-Il Kim, Chungcheongnam-do (KR)

(73) Assignee: Samsung Electronics Co., Ltd. (KR)

( * ) Notice: Subject to any disclaimer, the term of this patent is extended or adjusted under 35 U.S.C. 154(b) by 288 days.

(21) Appl. No.: 12/214,453

(22) Filed: Jun. 19, 2008

(65) Prior Publication Data

US 2009/0006913 A1 Jan. 1, 2009

(30) Foreign Application Priority Data

Jun. 28, 2007 (KR) ........................ 10-2007-0064121

(51) Int. Cl.
*G11C 29/00* (2006.01)

(52) U.S. Cl. ........................................................ 714/718

(58) Field of Classification Search .................. 714/718, 714/733, 738

See application file for complete search history.

(56) References Cited

U.S. PATENT DOCUMENTS 4,451,918 A * 5/1984 Gillette ......................... 714/743
4,835,774 A * 5/1989 Ooshima et al. .............. 714/719
5,506,849 A * 4/1996 Kato ............................ 714/719
5,721,708 A 2/1998 Tsai et al.
5,812,559 A * 9/1998 Nakaide et al. ............... 714/719
6,009,028 A * 12/1999 Akiyama ...................... 365/201
6,173,238 B1 * 1/2001 Fujisaki ........................ 702/117
6,175,529 B1 * 1/2001 Otsuka et al. ................. 365/201
6,415,399 B1 * 7/2002 Yamaoka ...................... 714/718
6,694,461 B1 * 2/2004 Treuer .......................... 714/719
6,769,084 B2 * 7/2004 Kim et al. ..................... 714/739
7,013,414 B2 * 3/2006 Takeshige et al. ............ 714/719
7,228,470 B2 * 6/2007 Saito ............................ 714/718
7,313,740 B2 * 12/2007 Ong ............................. 714/718
7,444,575 B2 * 10/2008 Ong ............................. 714/742
7,500,171 B2 * 3/2009 Suzuki .......................... 714/763
2002/0194557 A1 * 12/2002 Park ............................. 714/718

FOREIGN PATENT DOCUMENTS

JP 05282900 10/1993
JP H10031885 2/1998
KR 1998013729 5/1998
KR 20010001462 1/2001
KR 1020070002806 1/2007

OTHER PUBLICATIONS

Office Action issued on Oct. 31, 2008 in related Korean Patent Application No. 10-2007-0064121.
Decision of Grant issued on May 26, 2009 in related Korean Patent Application No. 10-2007-0064121.

* cited by examiner

*Primary Examiner* — James C Kerveros
(74) *Attorney, Agent, or Firm* — Onello & Mello, LLP

(57) ABSTRACT

A semiconductor memory device includes a test address generating circuit configured on the device. The test address generating circuit generates a plurality of test addresses for a test of the semiconductor memory device in response to at least one externally applied test address generation signal. As a result, the number of DUTs can increase, based on a reduction of required address pins, and manufacturing productivity and test efficiency of semiconductor memory devices can increase.

17 Claims, 5 Drawing Sheets

100
110
112
114
116
EX_TAS
ADDRESS INPUT UNIT
IN_TAS
SELECTION UNIT
E/N
IN_TAS
COUNTING UNIT
A0
A1
A13

SEMICONDUCTOR MEMORY DEVICE HAVING TEST ADDRESS GENERATING CIRCUIT AND METHOD OF TESTING SEMICONDUCTOR MEMORY DEVICE HAVING A TEST ADDRESS GENERATING CIRCUIT

CROSS REFERENCE TO RELATED APPLICATIONS

This application claims priority under 35 U.S.C. §119 to Korean Patent Application 10-2007-0064121, filed on Jun. 28, 2007, the contents of which are hereby incorporated by reference in their entirety for all purposes as if fully set forth herein.

BACKGROUND

1. Technical Field

Embodiments of the present invention relate to semiconductor memory devices, and more particularly, to a semiconductor memory device having a test address generating circuit and a test method thereof, which is capable of increasing the number of devices under test DUT based on a reduction of address pins and the productivity of semiconductor memory devices.

2. Description of Related Art

As semiconductor memory devices continue to become more highly integrated, the number of word lines and bit lines for accessing cells of the memory devices increases, as does the number of address pins required by the semiconductor memory device. Further, in the semiconductor memory device incorporated in a DDP (Dual Die Package) and MCP (Multi Chip Package), a command pin required for selecting one of a plurality of memory chips is additionally required. An increased pin count influences the requirements placed on test equipment used in testing the semiconductor memory devices.

Testers are generally restricted in the number of available drive channels, thus the number of semiconductor memory devices to be tested simultaneously by a tester, as the number of DUTs (Devices Under Test), is reduced in order to test highly-integrated semiconductor memory devices.

The correlation between drive channels of the tester and pins of the semiconductor memory device is described in further detail as follows.

A semiconductor memory device typically comprises a clock pin CK, /CK, command pins /RAS, /CAS, /WE, CKE, DQM, address pins A0~A15, and data DQ pins DQ0~DQ31, etc. The clock pin, command pin and address pins are typically coupled to a drive channel of the tester or I/O, and the DQ pins are typically coupled to an input/output port of the tester. As semiconductor memory devices become more highly integrated, the clock pins and the command pins remain comparatively fixed in number as compared to other pins, meanwhile, the address pins increase in number. Thus, a conventional test can be performed by the tester when the number of drive channels of the tester increases along with the number of address pins.

However, as described above, when the number of pins in a semiconductor memory device increases, the drive channels of the tester are generally already restricted by the tester configuration and thus can limit the testability of semiconductor memory devices. For example, the number of semiconductor memory devices coupled to test drive channels, in other words, the number of DUTs, can be reduced as the number of pins increases. As such, a reduction in productivity for the semiconductor memory devices can result.

SUMMARY OF THE INVENTION

Embodiments of the invention provide a device and test method thereof whereby semiconductor memory devices can be tested without reducing the number of semiconductor memory devices connected to a tester, even in cases where a semiconductor memory device becomes more highly integrated, thereby requiring an increased number of address pins.

Accordingly, some embodiments of the invention provide a semiconductor memory device having a test address generating circuit and a test method thereof. The number of DUTs increases by decreasing the number of address pins. In this manner, productivity and test efficiency of the semiconductor memory devices can increase.

In one aspect, a semiconductor memory device comprises a test address generating circuit configured on semiconductor memory device, the test address generating circuit configured to generate a plurality of test addresses for a test of the semiconductor memory device in response to at least one externally applied test address generation signal.

In one embodiment, the test address generation signal is applied by an external tester, and the test address generating circuit generates a test address that is not applied by the tester, in response to the test address generation signal.

In another embodiment, the test address generating circuit generates a block address in response to the external test address generation signal, and the block address selects one of a plurality of memory blocks of the semiconductor memory device.

In another embodiment, the test address generating circuit comprises: an address input unit that receives the external test address generation signal, and that generates an internal address generation signal to generate the test address; a counting unit including at least one counter that generates the plurality of test addresses in response to the internal address generation signal; and a selection unit that transmits the test address generation signal to a single counter when the counter of the counting unit is single, and selecting at least one of a plurality of counters and transmitting the test address generation signal to a selected counter, when the counters of the counting unit are plural.

In another embodiment, the address input unit comprises at least one input buffer.

In another embodiment, the counting unit comprises: a first counting unit that counts up from a first initial value, and that generates a plurality of test addresses; a second counting unit that counts down from a second initial value, and that generates a plurality of test addresses; a third counting unit that counts up from the first initial value, and that generates a plurality of test addresses, at a counting cycle that is different from the first counting unit; a fourth counting unit that counts down from the second initial value, and that generates a plurality of test addresses, at a counting cycle that is different from the second counting unit; and a fifth counting unit that alternately performs operations of the first and second counting units.

In another embodiment, a counting cycle of the third counting unit is twice a counting cycle of the first counting unit, and wherein a counting cycle of the fourth counting unit is twice a counting cycle of the second counting unit.

In another embodiment, the fifth counting unit comprises a first counter that performs an operation of the first counting unit and a second counter that performs an operation of the second counting unit.

In another embodiment, the selection unit comprises a multiplexer that selects at least one of the plurality of counters.

In another embodiment, the test address generation signal is a block address generation signal to select a block of the semiconductor memory device, or a memory cell address generation signal to select a memory cell of the semiconductor memory device.

In another embodiment, when the memory cell address is applied by the external tester, the external tester applies a test address generation signal to generate the block address, and when the block address is applied by the external tester, the external tester applies a test address generation signal to generate the memory cell address.

In another embodiment, when the test address generation signal contains both the memory cell address generation signal and the block address generation signal, an address is not applied by the external tester.

In another aspect, a method of testing a semiconductor memory device, comprises: generating, at the semiconductor memory device, a test address in response to an address generation signal applied from an external source, when operating in a test mode, and performing an access operation for a test, and performing an access for a read or write operation in response to an address applied from the external source when operating in a normal mode.

In one embodiment, the test address is a block address to select a memory block of the semiconductor memory device.

In another aspect, a method of testing a semiconductor memory device having a test address generating circuit, the method comprises: a first step of applying at least one test address generation signal from an external source during a test operation; and a second step of generating, at the semiconductor memory device, a plurality of test addresses by at least one counting method selected from a plurality of different counting methods, in response to the test address generation signal.

In one embodiment, the counting methods comprise: a first counting method for counting up from a first initial value, and generating a plurality of test addresses; a second counting method for counting down from a second initial value, and generating a plurality of test addresses; a third counting method for counting up from the first initial value, and generating a plurality of test addresses, at a counting cycle that is different from the first counting method; a fourth counting method for counting down from the second initial value, and generating a plurality of test addresses, at a counting cycle that is different from the second counting method; and a fifth counting method for alternately performing the first and second counting methods.

In another embodiment. a counting cycle of the third counting method is twice a counting cycle of the first counting method, and wherein a counting cycle of the fourth counting method is twice a counting cycle of the second counting method.

In another embodiment, the test address is a block address to select a memory block of the semiconductor memory device.

In another aspect, a test system is provided for use in a semiconductor memory device having a test address generating circuit, the system comprising: a tester that generates a command signal and address generation signals according to a programmed sequence, and that applies the signals to the semiconductor memory device for operating the device; and a semiconductor memory device that generates a test address corresponding to the address generation signal in response to the address generation signal applied by the tester.

In one embodiment, the semiconductor memory device generates a block address to select a memory block of the semiconductor memory device.

In another embodiment, the test address generation signal is a block address generation signal to select a block of the semiconductor memory device, or a memory cell address generation signal to select a memory cell of the semiconductor memory device.

In another embodiment, when the memory cell address is applied by the tester, the tester applies a test address generation signal to generate the block address, and when the block address is applied by the tester, the tester applies a test address generation signal to generate the memory cell address.

In another embodiment, the semiconductor memory device comprises: an address input unit that receives the test address generation signal from the outside, and that generates an internal address to generate the test address; a counting unit including at least one counter that generates the plurality of test addresses in response to the internal address; and a selection unit that transmits the test address generation signal to a single counter when the counter of the counting unit is single, and that selects at least one of a plurality of counters and transmitting the test address generation signal to a selected counter when the counters of the counting unit are plural.

In another embodiment, the address input unit comprises at least one input buffer.

In another embodiment, the counting unit comprises: a first counting unit that counts up from a first initial value, and that generates a plurality of test addresses; a second counting unit that counts down from a second initial value, and that generates a plurality of test addresses; a third counting unit that counts up from the first initial value, and that generates a plurality of test addresses, at a counting cycle that is different from the first counting unit; a fourth counting unit that counts down from the second initial value, and that generates a plurality of test addresses, at a counting cycle that is different from the second counting unit; and a fifth counting unit that alternately performs operations of the first and second counting units.

In another embodiment, a counting cycle of the third counting unit is twice a counting cycle of the first counting unit, and wherein a counting cycle of the fourth counting unit is twice a counting cycle of the second counting unit.

In another embodiment, the fifth counting unit comprises a first counter that performs an operation of the first counting unit and a second counter that performs an operation of the second counting unit.

BRIEF DESCRIPTION OF THE DRAWINGS

The foregoing and other objects, features and advantages of the embodiments of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings.

DETAILED DESCRIPTION OF EMBODIMENTS

Embodiments of the present invention will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification.

It will be understood that, although the terms first, second, etc. are used herein to describe various elements, these elements should not be limited by these terms. These terms are used to distinguish one element from another. For example, a first element could be termed a second element, and, similarly, a second element could be termed a first element, without departing from the scope of the present invention. As used herein, the term “and/or” includes any and all combinations of one or more of the associated listed items.

It will be understood that when an element is referred to as being “on” or “connected” or “coupled” to another element, it can be directly on or connected or coupled to the other element or intervening elements can be present. In contrast, when an element is referred to as being “directly on” or “directly connected” or “directly coupled” to another element, there are no intervening elements present. Other words used to describe the relationship between elements should be interpreted in a like fashion (e.g., “between” versus “directly between,” “adjacent” versus “directly adjacent,” etc.). When an element is referred to herein as being “over” another element, it can be over or under the other element, and either directly coupled to the other element, or intervening elements may be present, or the elements may be spaced apart by a void or gap.

The terminology used herein is for the purpose of describing particular embodiments and is not intended to be limiting of the invention. As used herein, the singular forms “a,” “an” and “the” are intended to include the plural forms as well, unless the context clearly indicates otherwise. It will be further understood that the terms “comprises,” “comprising,” “includes” and/or “including,” when used herein, specify the presence of stated features, integers, steps, operations, elements, and/or components, but do not preclude the presence or addition of one or more other features, integers, steps, operations, elements, components, and/or groups thereof.

Figure 1:
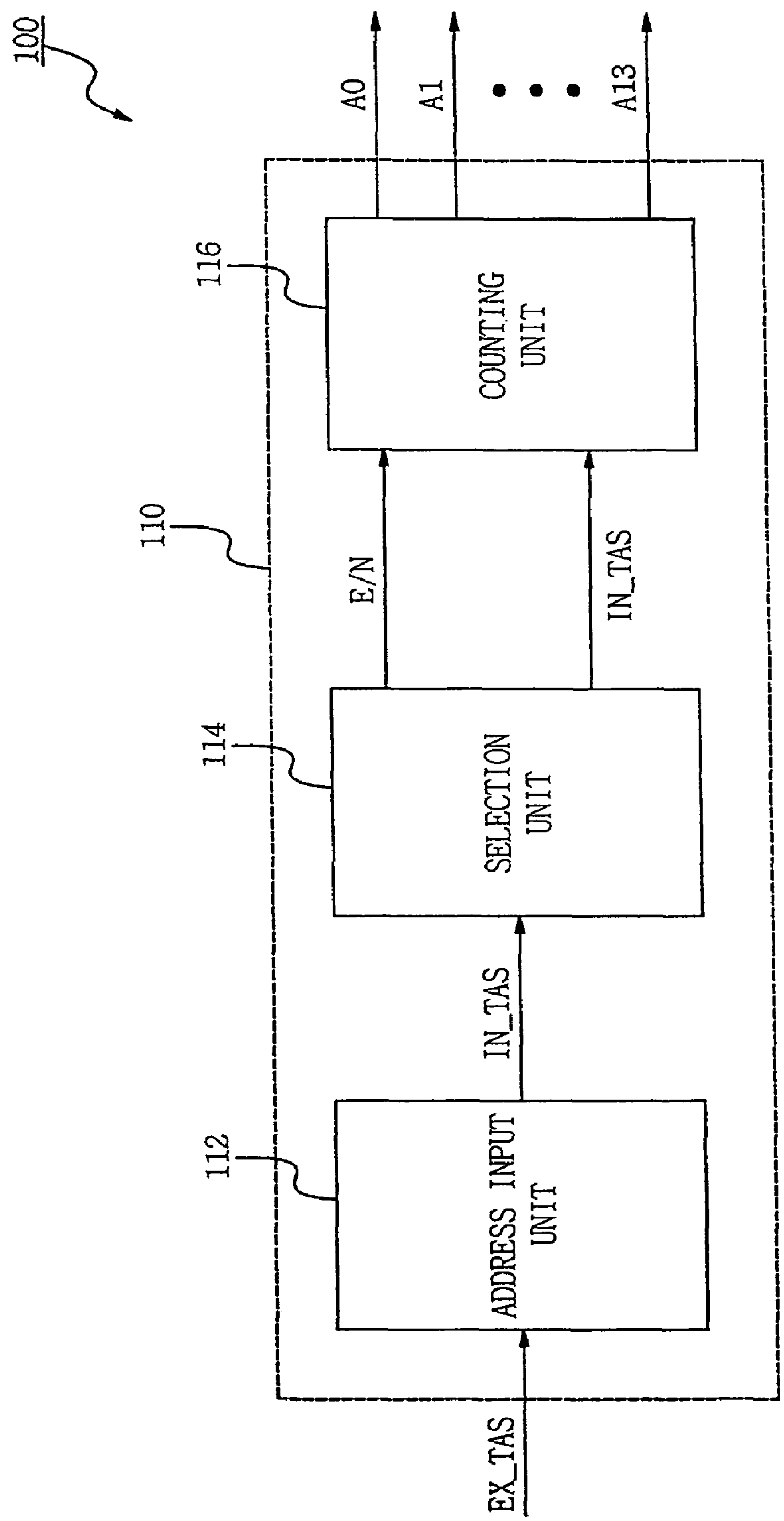
FIG. 1 is a block diagram of a semiconductor memory device according to an embodiment of the invention.

FIG. 1 is a block diagram of a semiconductor memory device according to an embodiment of the invention;

Referring to FIG. 1, a test address generating circuit 110 included in a semiconductor memory device 100 comprises an address input unit 112, a selection unit 114 and a counting unit 116.

The address input unit 112 comprises at least one address input buffer (not shown). The address input unit 112 receives an external test address generation signal EX_TAS from a tester external to the semiconductor memory device, and generates an internal address generation signal IN_TAS in response to the external test address generation signal EX_TAS.

The address input unit 112 is adapted for use during normal operation of the device, and is optionally not operational during a test operation of the invention.

The selection unit 114 can comprise, in one embodiment, a multiplexer. The selection unit 114 transmits the internal address generation signal IN_TAS to at least one selected counting unit of a plurality of counting units provided in the counting unit 116.

The selection unit 114 generates an enable signal E/N to operate the selected counting unit of the counting unit 116, and transfers it to the counting unit 116. In another embodiment, the selection unit 114 may optionally be configured to operate the selected counting unit with only the selection operation, without the need for generation or transmission of the enable signal E/N.

The counting unit 116 comprises at least one counting sub-unit (not shown). The counting unit 116 generates a plurality of test address bits A0, A1 . . . A13 in response to the internal address generation signal IN_TAS.

In operation, the test address generating circuit 110 can perform as follows.

When at least one external test address generation signal EX_TAS is applied to the address input unit 112, the address input unit 112 can generate a single, or a plurality of, test address bits A0, A1 . . . A13 in response to the applied signal.

For example, when the external test address generation signal EX_TAS is a memory cell address generation signal to select a memory cell of the semiconductor memory device 100, the address input unit 112 can be configured to generate corresponding memory cell address bits. Alternatively, when the external test address generation signal EX_TAS is a block address generation signal to select a memory block of the semiconductor memory device 100, the address input unit 112 can be configured to generate corresponding block address bits.

For example, assume that an address of the semiconductor memory device 100 includes 14 bits A0~A13, and that A0~A10 indicate a memory cell address and A11~A13 indicate a block address. In this case, the external test address generation signal EX_TAS may be a memory cell address generation signal to generate the memory cell address A0~A10, and may be a block address generation signal to generate the block address A11~A13, and also may be an address generation signal to generate all addresses A0~A13.

A test address generating circuit 110 configured to generate all addresses A0~A13 is described as follows, and in FIG. 4, a test address generating circuit to generate a block address or memory cell address will be described below.

Figure 2:
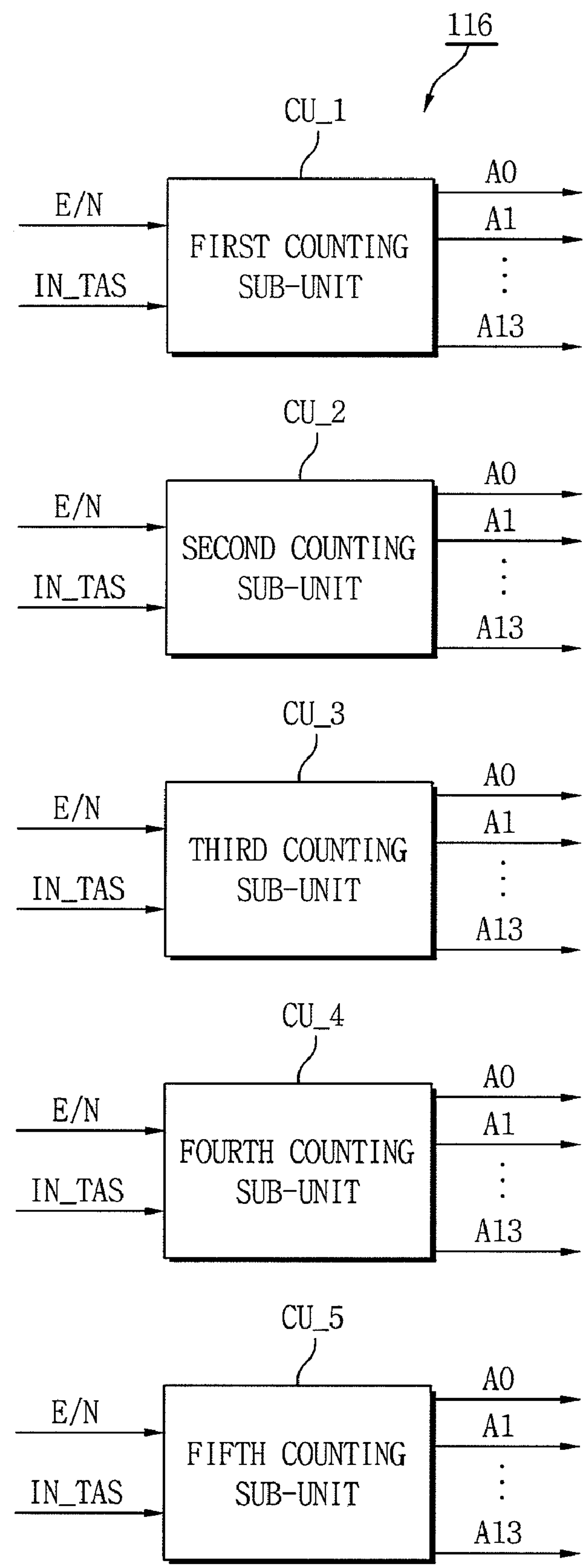
FIG. 2 is a block diagram of an example embodiment of the counting unit of FIG. 1.

FIG. 2 is a block diagram of an example embodiment of the counting unit of FIG. 1.

As shown in FIG. 2, in this embodiment, the counting unit 116 comprises a first counting sub-unit CU_1, a second counting sub-unit CU_2, a third counting sub-unit CU_3, a fourth counting sub-unit CU_4, and a fifth counting sub-unit CU_5.

The first counting sub-unit CU_1 counts up from an initial value. When a counting unit enable signal E/N generated by the selection unit 114 is applied to the first counting sub-unit CU_1, the first counting sub-unit CU_1 operates.

For example, when an initial value of the first counting sub-unit CU_1 is a ‘first initial value’, the first initial value may be “000 00000000000”. The “000 00000000000” value refers to an address including memory cell address A0~A10 and block address A11~A13. This may be regarded as a bit value of plural test addresses. Thus, when the internal address generation signal IN_TAS is applied to the first counting sub-unit CU_1, the first initial value (“000 00000000000”) is increased by one bit, sequentially from “000 00000000001” to “11111111111111”.

The first counting sub-unit CU_1 is also configured to generate the plurality of test addresses A0, A1 . . . A13, whenever the internal test address generation signal IN_TAS is applied.

However, in this example, the remainder of the second, third, fourth and fifth counting sub-units CU_2, CU_3, CU_4 and CU_5 included within the counting unit 116 do not receive a counting unit enable signal, thus the counting sub-units CU_2, CU_3, CU_4 and CU_5 do not operate.

The second counting sub-unit CU_2 counts down direction from an initial value. When a counting unit enable signal E/N generated by the selection unit 114 is applied to the second counting sub-unit CU_2, the second counting sub-unit CU_2 operates.

For example, when an initial value of the second counting sub-unit CU_2 is a "second initial value", the second initial value may be "111 11111111111". Thus, when the internal address generation signal IN_TAS is applied to the second counting sub-unit CU_2, the second initial value ("111 11111111111") is reduced by one bit, sequentially from "111 11111111110" to "000 00000000000".

The second counting sub-unit CU_2 generates the plurality of test addresses A0, A1 . . . A13, whenever the internal test address generation signal IN_TAS is applied.

However, in this example, the remainder of the first, third, fourth and fifth counting sub-units CU_1, CU_3, CU_4 and CU_5 included within the counting unit 116 do not receive a counting unit enable signal, thus the counting sub-units CU_1, CU_3, CU_4 and CU_5 do not operate.

The third counting sub-unit CU_3 counts up from an initial value. When a counting unit enable signal E/N generated by the selection unit 114 is applied to the third counting sub-unit CU_3, the third counting sub-unit CU_3 operates. The third counting sub-unit CU_3 has the same initial value as the first counting sub-unit CU_1, but has a counting cycle that is longer than, or twice that, of the first counting sub-unit CU_1.

For example, when an initial value of the third counting sub-unit CU_3 is a 'first initial value', the first initial value may be "000 00000000000". Thus, when the internal address generation signal IN_TAS is applied to the third counting sub-unit CU_3, the first initial value ("000 00000000000") is increased by one bit, sequentially from "000 00000000001" to "111 11111111111".

The third counting sub-unit CU_3 is also configured to generate the plurality of test addresses A0, A1 . . . A13, whenever the internal test address generation signal IN_TAS is applied, and its generation period is twice that of the first counting sub-unit CU_1.

In this example, the remainder of the first, second, fourth and fifth counting sub-units CU_1, CU_2, CU_4 and CU_5 included within the counting unit 116 do not receive a counting unit enable signal, thus the counting sub-units CU_1, CU_2, CU_4 and CU_5 do not operate.

The fourth counting sub-unit CU_4 counts down from an initial value. When counting unit enable signal E/N generated in the selection unit 114 is applied to the fourth counting sub-unit CU_4, the fourth counting sub-unit CU_4 operates. The fourth counting sub-unit CU_4 has the same initial value as the second counting sub-unit CU_2, but has a counting cycle that is twice that of the second counting sub-unit CU_2.

For example, when an initial value of the fourth counting sub-unit CU_4 is a "second initial value", the second initial value may be "111 11111111111". Thus, when the internal address generation signal IN_TAS is applied to the fourth counting sub-unit CU_4, the first initial value ("111 11111111111") is reduced by one bit, sequentially from "111 11111111110" to "000 00000000000".

The fourth counting sub-unit CU_4 is also configured to generate the plurality of test addresses A0, A1 . . . A13, whenever the internal test address generation signal IN_TAS is applied, and its generation period is twice that of the second counting sub-unit CU_2.

In this example, the remainder of the first, second, third and fifth counting sub-units CU_1, CU_2, CU_3 and CU_5 included within the counting unit 116 do not receive a counting unit enable signal E/N, thus the counting sub-units CU_1, CU_2, CU_3 and CU_5 do not operate.

Figure 3:
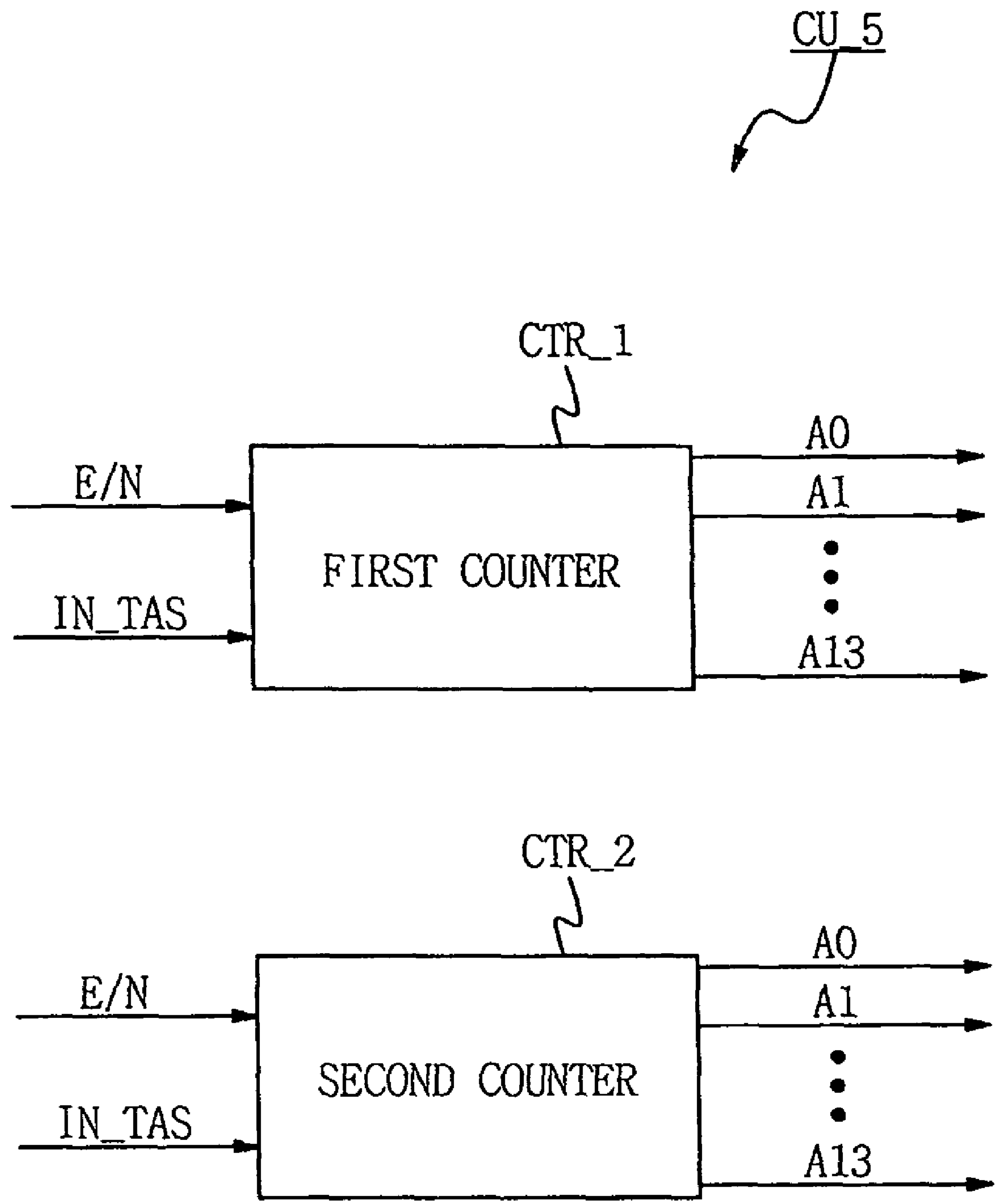
FIG. 3 is a block diagram of an example embodiment of the fifth counting unit of FIG. 2.

FIG. 3 is a block diagram of an example embodiment of the fifth counting sub-unit of FIG. 2.

As shown in FIG. 3, the fifth counting sub-unit CU_5 comprises a first counter CTR_1 for performing operation of the first counting sub-unit CU_1 and a second counter CTR_2 for performing operation of the second counting sub-unit CU_2.

The first counter CTR_1 or second counter CTR_2 operates according to an initial value of the fifth counting sub-unit CU_5. For example, when the initial value of the fifth counting sub-unit CU_5 has a first initial value of "000 00000000000" equal to the first counting sub-unit CU_1, the first counter CTR_1 operates and generates a plurality of test addresses A0, A1 . . . A13. A bit value of the test addresses A0, A1 . . . A13 counted by the first counter CTR_1 is equal to a bit value counted by the first counting sub-unit CU_1. Subsequently, when a second internal test generation signal IN_TAS is applied to the fifth counting sub-unit CU_5, the second counter CTR_2 operates to generate a plurality of test addresses A0, A1 . . . A13. At this time, a bit value of the test addresses A0, A1 . . . A13 counted by the second counter CTR_2 is equal to a bit value counted by the second counting sub-unit CU_2.

The fifth counting sub-unit CU_5 operates the first and second counters CTR_1 and CTR_2 alternately and repetitively, whenever the internal test address generation signal IN_TAS is applied.

The fifth counting sub-unit CU_5 selects a counter that operates according to an initial value, thus when the second counter CTR_2 adapted within the fifth counting sub-unit CU_5 operates, the first counter CTR_1 adapted within the fifth counting sub-unit CU_5 does not operate, and vice versa.

When the counting unit 116 of FIG. 2 includes a plurality of counting sub-units CU_1, CU_2, CU_3, CU_4 and CU_5 as described above, the enable signal E/N applied from the selection unit 114 may be used as a selection signal to select one of the plurality of counting sub-units CU_1, CU_2, CU_3, CU_4 and CU_5.

Semiconductor memory devices are generally comprised of a plurality of banks, and each bank is divided into a plurality of memory blocks, and the memory blocks each include a plurality of memory cells. The block address is an address that indicates a memory block. Thus, the block address is used when a user designates a specific memory block of a semiconductor memory device for testing.

Further, when the test address generation signal TAS is a memory cell address generation signal, a plurality of test addresses TADD_0, TADD_1, TADD_2 . . . generated when the test address generation signal TAS is applied to semiconductor memory device 100 from an external source are memory cell addresses that operate to select a particular memory cell of the semiconductor memory device 100. The memory cell addresses operate to select memory cells provided as a selection of word line or bit line provided within the semiconductor memory device 100.

In this manner, the test address generating circuit 110 receives at least one address generation signal, and generates a plurality of test addresses.

Another embodiment of the invention is now described as follows.

Figure 4:
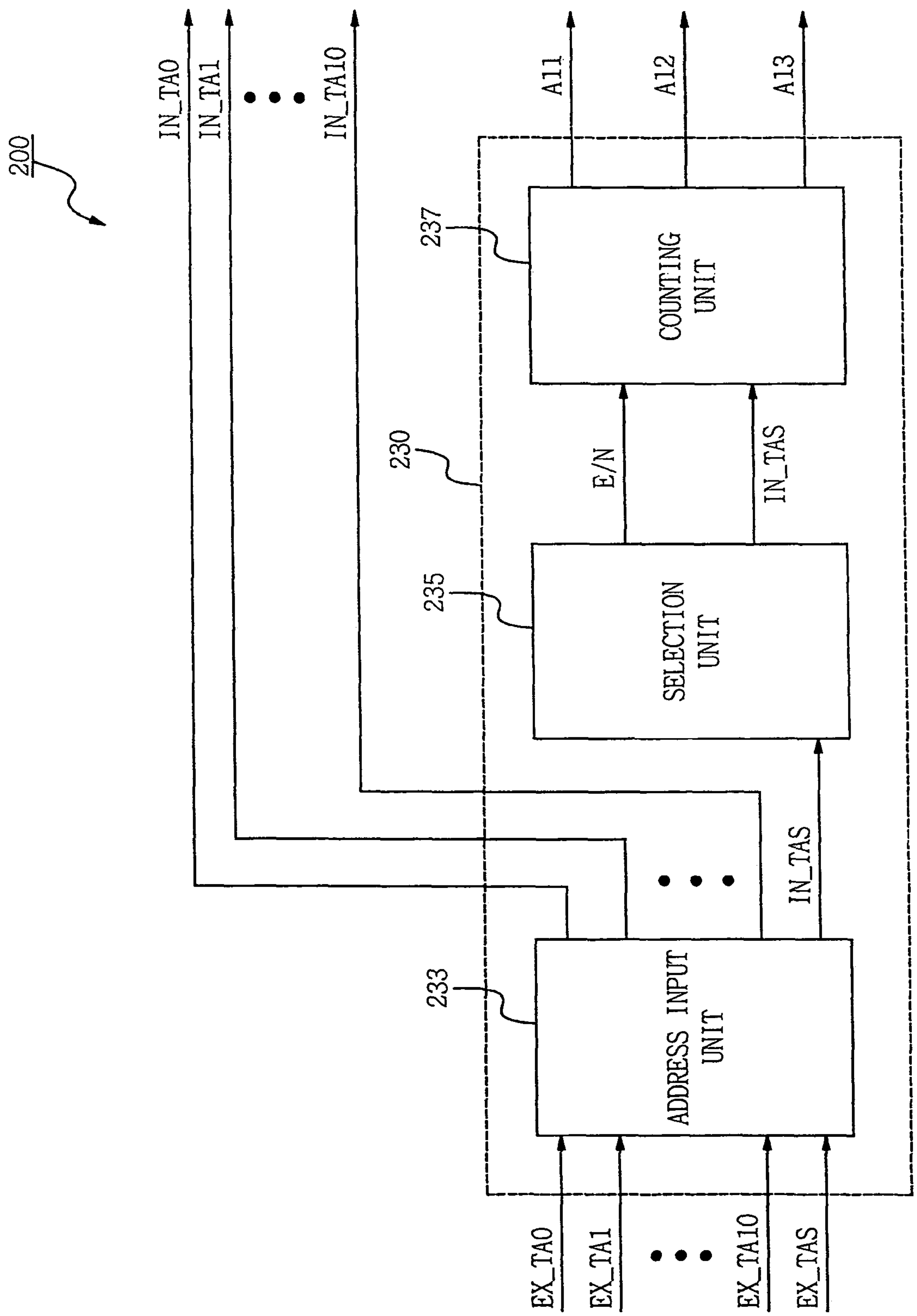
FIG. 4 is a block diagram of a semiconductor memory device according to another embodiment of the invention.

FIG. 4 is a block diagram of a semiconductor memory device according to another embodiment of the invention. Referring to FIG. 4, the semiconductor memory device receives a memory cell address from the tester among an entire address including memory cell addresses and a block addresses, and generates a block address, thereby performing a test.

In another embodiment of the invention, a semiconductor memory device can receive a block address from the tester and generate a memory cell address, thereby performing a test, and this can be readily realized by those skilled in the art through the embodiment of FIG. 4, thus a description therefor is omitted.

As shown in FIG. 4, the semiconductor memory device 200 comprises an address input unit 233, selection unit 235 and counting unit 237.

The address input unit 233 performs a buffering operation of memory cell addresses EX_TA0, EX_TA1 . . . EX_TA10 and outputs them, and performs a buffering of external test address generation signal EX_TAS and outputs it to the selection unit 235.

The selection unit 235 and the counting unit 237 are configured similar to the same units of FIG. 1, with the exception of generating a block address and referring with different reference characters in different drawings, thus a detailed description thereof is omitted.

Figure 5:
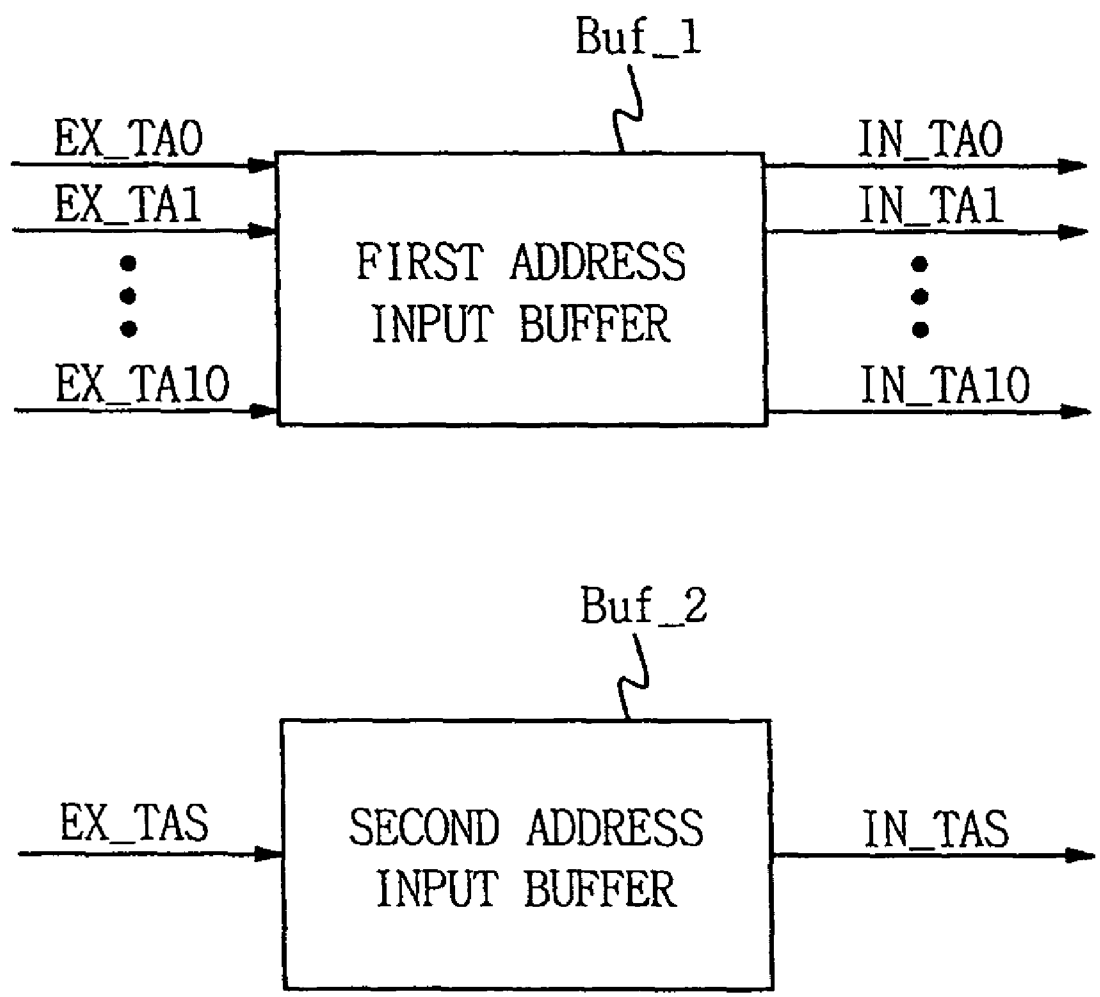
FIG. 5 is a block diagram of an example embodiment of the address input unit of FIG. 4.

FIG. 5 is a block diagram of an example embodiment of the address input unit of FIG. 4.

As shown in FIG. 5, the address input unit 233 comprises a first address input buffer Buf_1 and a second address input buffer Buf_2.

The first address input buffer Buf_1 receives a plurality of external test addresses EX_TA0, EX_TA1 . . . EX_TA10 from an external tester, and performs a buffering of internal test addresses IN_TA0, IN_TA1 . . . IN_TA10, and outputs them. For example, the plurality of internal test addresses IN_TA0, IN_TA1 . . . IN_TA10 may be memory cell addresses of the semiconductor memory device 230.

The second address input buffer Buf_2 receives at least one external test address generation signal EX_TAS from the external tester, and outputs at least one internal address generation signal IN_TAS. The internal address generation signal IN_TAS is transferred to counting unit 237 of the semiconductor memory device 230 as described above with reference to FIG. 1, and may be output as a plurality of block addresses A11, A12 and A13 to select a memory block of the semiconductor memory device 230.

For example, when an initial value of the first counting sub-unit CU_1 of the counting unit 237 in the same configuration as FIG. 1 is a 'first initial value', the first initial value may be "000". At this time, the value "000" indicates a bit value of the plurality of block addresses A11~A13. When the internal address generation signal IN_TAS is applied to the first counting sub-unit CU_1, the first initial value "000" is increased by one bit, sequentially from "001" to "111".

Then, the first counting sub-unit CU_1 generates the plurality of block addresses A11, A12 and A13 whenever the internal test address generation signal IN_TAS is applied.

For example, when an initial value of the second counting sub-unit CU_2 is a 'second initial value', the second initial value may be "111". Thus, at this time, when the internal address generation signal IN_TAS is applied to the second counting sub-unit CU_2, the first initial value "111" is reduced by one bit, sequentially from "011" to "000".

Then, the second counting sub-unit CU_2 generates the plurality of block addresses A11, A12 and A13 whenever the internal test address generation signal IN_TAS is applied.

When an initial value of the third counting sub-unit CU_3 is a 'first initial value', the first initial value may be "000". Thus, when the internal address generation signal IN_TAS is applied to the third counting sub-unit CU_3, the first initial value "000" is counted by one bit, sequentially from "001" to "111".

Then, the third counting sub-unit CU_3 generates the plurality of block addresses A11, A12 and A13 whenever the internal test address generation signal IN_TAS is applied, and its generation period is twice the first counting sub-unit CU_1.

When an initial value of the fourth counting sub-unit CU_4 is a 'second initial value', the second initial value may be "111". Thus, when the internal address generation signal IN_TAS is applied to the fourth counting sub-unit CU_4, the second initial value "111" is counted by one bit, sequentially from "011" to "000".

Then, the fourth counting sub-unit CU_4 generates the plurality of block addresses A11, A12 and A13 whenever the internal test address generation signal IN_TAS is applied, and its generation period is twice the second counting sub-unit CU_2.

First counter CTR_1 or second counter CTR_2 operates according to the initial value of the fifth counting sub-unit CU_5. At this time, when the initial value of the fifth counting sub-unit CU_5 is a first initial value "000" equal to that of the first counting sub-unit CU_1, the first counter CTR_1 operates and generates the plurality of block addresses A11, A12 and A13. A bit value of the block addresses A11, A12 and A13 counted by the first counter CTR_1 is the same as a bit value counted through the first counting sub-unit CU_1. Subsequently, when a second internal test generation signal IN_TAS is applied to the fifth counting sub-unit CU_5, the second counter CTR_2 operates and generates plural block addresses A11, A12 and A13. At this time, a bit value of the plurality of block addresses A11, A12 and A13 counted by the second counter CTR_2 is the same as a bit value counted by the second counting sub-unit CU_2.

Then, the fifth counting sub-unit CU_5 operates the first and second counters CTR_1 and CTR_2 alternately and repetitively whenever the internal test address generation signal IN_TAS is applied.

Accordingly, a plurality of test addresses for a test of the semiconductor memory device can be generated using only a single, externally applied, test address generation signal. Because only a single signal is needed, the number of pins required by the tester to initiate the test address generation signal can be reduced. As a result, a remainder of the unassigned pins, can be connected to other semiconductor memory device, and so the number of semiconductor memory devices to be simultaneously tested, as the number of DUTs, can increase.

As described above, according to some embodiments of the invention, a test address generating circuit is adapted within a semiconductor memory device, thereby increasing the number of DUTs based on a reduction of address pins. As a result, manufacturing productivity of the semiconductor memory devices, and test efficiency can increase.

While embodiments of the invention have been particularly shown and described with references to preferred embodiments thereof, it will be understood by those skilled in the art that various changes in form and details may be made herein without departing from the spirit and scope of the invention as defined by the appended claims.

What is claimed is:

1. A semiconductor memory device comprising:

a test address generating circuit configured on semiconductor memory device, the test address generating circuit configured to generate a plurality of test addresses for a test of the semiconductor memory device in response to at least one externally applied test address generation signal, wherein the test address generating circuit comprises:

a counting unit, including a plurality of counting sub-units, that generates the plurality of test addresses in response to an internal address generation signal, the plurality of counting sub-units including a first counting sub-unit that counts up from a first initial value, and that generates a plurality of test addresses, and a second counting sub-unit that counts down from a second initial value, and that generates a plurality of test addresses;

an address input unit that receives the externally applied test address generation signal, and that generates the internal address generation signal to generate the test address; and a selection unit that selects one of the plurality of counting sub-units and transmits the internal address generation signal to the selected counting sub-unit.

2. The device of claim 1, wherein the at least one externally applied test address generation signal is applied by an external tester to the test address generating circuit, and wherein the test address generating circuit generates a test address in response to the externally applied test address generation signal, the test address being applied internally in the semiconductor memory device.

3. The device of claim 2, wherein the test address generating circuit generates a block address in response to the externally applied test address generation signal, and the block address selects one of a plurality of memory blocks of the semiconductor memory device.

4. The device of claim 2, wherein the externally applied test address generation signal is a block address generation signal to select a block of the semiconductor memory device, or a memory cell address generation signal to select a memory cell of the semiconductor memory device.

5. The device of claim 4, wherein when the memory cell address is applied by the external tester, the external tester applies a test address generation signal to generate the block address, and when the block address is applied by the external tester, the external tester applies a test address generation signal to generate the memory cell address.

6. The device of claim 5, wherein when the test address generation signal contains both the memory cell address generation signal and the block address generation signal, a memory cell address and a block address are applied internally in the semiconductor device.

7. The device of claim 1, wherein the address input unit comprises at least one input buffer.

8. The device of claim 1, wherein the plurality of sub-counting units further includes:

a third counting sub-unit that counts up from the first initial value, and that generates a plurality of test addresses, at a counting cycle that is different from the first counting sub-unit;

a fourth counting sub-unit that counts down from the second initial value, and that generates a plurality of test addresses, at a counting cycle that is different from the second counting sub-unit; and a fifth counting sub-unit that alternately performs operations of the first and second counting sub-units.

9. The device of claim 8, wherein a counting cycle of the third counting sub-unit is twice a counting cycle of the first counting sub-unit, and wherein a counting cycle of the fourth counting sub-unit is twice a counting cycle of the second counting sub-unit.

10. The device of claim 8, wherein the fifth counting sub-unit comprises a first counter that performs an operation of the first counting sub-unit and a second counter that performs an operation of the second counting sub-unit.

11. The device of claim 1, wherein the selection unit comprises a multiplexer that selects at least one of the plurality of counting sub-units.

12. A method of testing a semiconductor memory device, comprising:

receiving an externally applied test address generation signal, and generating an internal address generation signal to generate a test address;

transmitting the internal address generation signal to a counting sub-unit by selecting one of a plurality of counting sub-units of a counting unit and transmitting the internal address generation signal to the selected counting sub-unit;

generating, at the semiconductor memory device, a test address in response to the externally applied test address generation signal, when operating in a test mode, and performing an access operation for a test, wherein the test address is generated by the counting unit performing one counting method selected from a plurality of different counting methods, the counting methods comprising:

a first counting method for counting up from a first initial value, and generating a plurality of test addresses; and a second counting method for counting down from a second initial value, and generating a plurality of test addresses; and performing an access for a read or write operation in response to an address applied from the external source when operating in a normal mode.

13. The method of claim 12, wherein the test address is a block address to select a memory block of the semiconductor memory device.

14. A method of testing a semiconductor memory device having a test address generating circuit, the test address generating circuit having a counting unit, the method comprising:

a first step of applying at least one test address generation signal from an external source during a test operation to the test address generating circuit;

a second step of receiving the externally applied test address generation signal at the test address generating circuit, and generating an internal address generation signal to generate a test address;

a third step of transmitting the internal address generation signal to the counting unit, the counting unit comprising a plurality of counting sub-units, by selecting one of the plurality of counting sub-units and transmitting the internal address generation signal to the selected counting sub-unit;

a fourth step of generating, at the semiconductor memory device, a plurality of test addresses by the counting unit performing one counting method selected from a plurality of different counting methods, in response to the test address generation signal, wherein the counting methods comprise:

a first counting method for counting up from a first initial value, and generating a plurality of test addresses; and a second counting method for counting down from a second initial value, and generating a plurality of test addresses.

15. The method of claim 14, wherein the counting methods further comprise:

a third counting method for counting up from the first initial value, and generating a plurality of test addresses, at a counting cycle that is different from the first counting method;

a fourth counting method for counting down from the second initial value, and generating a plurality of test addresses, at a counting cycle that is different from the second counting method; and a fifth counting method for alternately performing the first and second counting methods.

16. The method of claim 15, wherein a counting cycle of the third counting method is twice a counting cycle of the first counting method, and wherein a counting cycle of the fourth counting method is twice a counting cycle of the second counting method.

17. The method of claim 15, wherein the test address is a block address to select a memory block of the semiconductor memory device.

* * * * *